United States Patent
Volodymyr et al.

(10) Patent No.: US 8,319,650 B2
(45) Date of Patent: *Nov. 27, 2012

(54) APPARATUS AND METHOD FOR SENSING LEAKAGE CURRENT OF BATTERY

(75) Inventors: Akimov Volodymyr, Daejeon (KR); Ju-Hyun Kang, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/398,401

(22) Filed: Feb. 16, 2012

(65) Prior Publication Data

US 2012/0146651 A1    Jun. 14, 2012

Related U.S. Application Data

(63) Continuation of application No. 12/672,291, filed as application No. PCT/KR2008/004630 on Aug. 8, 2008, now Pat. No. 8,144,024.

(30) Foreign Application Priority Data

Aug. 8, 2007 (KR) .......................... 10-2007-0079568

(51) Int. Cl.
    *G08B 21/00*    (2006.01)
(52) U.S. Cl. ................. 340/636.1; 340/636.13; 340/664; 320/128; 320/134; 323/282; 323/284

(58) Field of Classification Search ............... 340/636.1, 340/636.11, 636.13, 664, 693; 320/107, 320/119, 128, 134, 136; 323/282, 284, 285
See application file for complete search history.

(56) References Cited

U.S. PATENT DOCUMENTS

| | | | | |
|---|---|---|---|---|
| 5,481,194 | A * | 1/1996 | Schantz et al. | 324/522 |
| 5,818,236 | A * | 10/1998 | Sone et al. | 324/509 |
| 5,854,555 | A * | 12/1998 | Sasaki | 324/539 |
| 6,177,780 | B1 | 1/2001 | Roy et al. | |
| 6,316,925 | B1 | 11/2001 | Canter | |
| 6,998,819 | B2 * | 2/2006 | Jin | 320/136 |
| 7,330,361 | B1 | 2/2008 | Chu | |
| 7,629,794 | B2 * | 12/2009 | Kamata | 324/509 |
| 2002/0011935 | A1 * | 1/2002 | Kim | 340/635 |
| 2010/0156426 | A1 * | 6/2010 | Kang et al. | 324/444 |
| 2010/0237872 | A1 * | 9/2010 | Kang et al. | 324/429 |

* cited by examiner

*Primary Examiner* — Hung T. Nguyen (74) *Attorney, Agent, or Firm* — Birch, Stewart, Kolasch & Birch, LLP (57) ABSTRACT

An apparatus for sensing leakage current of a battery includes a current sensing resistance installed on a current detection path of positive and negative terminals of a battery; a DC (Direct Current) voltage applying unit for inducing a potential difference with an opposite polarity to the current detection path through the current sensing resistance; and a leakage current determining unit for sensing a magnitude of current flowing through the current sensing resistance according to the induced potential difference on the current detection path, and determining based on the sensed magnitude of current whether leakage current occurs.

23 Claims, 4 Drawing Sheets

APPARATUS AND METHOD FOR SENSING LEAKAGE CURRENT OF BATTERY

CROSS-REFERENCE TO RELATED APPLICATION

This application is a Continuation of application Ser. No. 12/672,291, filed on Feb. 7, 2011, now U.S. Pat. No. 8,144,024. application Ser. No. 12/672,291 is the National Phase of PCT International Application No. PCT/KR2008/004630 filed on Aug. 8, 2008, and claims priority under 35 U.S.C. §119(a) to Patent Application No. 10-2007-0079568 filed in Korea on Aug. 8, 2007, all of which are hereby expressly incorporated by reference into the present application.

TECHNICAL FIELD

The present invention relates to apparatus and method for sensing leakage current of a battery, and more particularly to apparatus and method for sensing leakage current of a battery, which may sense leakage current of a battery adopted to a battery power supply system that requires high voltage, such as an electric vehicle or a hybrid vehicle.

BACKGROUND ART

In recent, as the interest on electric or hybrid vehicles not using fossil energy but using electric energy due to exhaustion of fossil fuels and environmental pollution is increased, the study on electric or hybrid vehicles is actively progressed. An electric or hybrid vehicle needs electric energy to drive a motor used for the vehicle, and the electric energy should be supplied by means of a battery.

A battery used for the electric or hybrid vehicle generally adopts a secondary battery, which may repeat a discharging process for converting chemical energy into electric energy and a charging process for converting electric energy into chemical energy. Such a secondary battery includes a nickel-cadmium battery, a nickel-hydrogen battery, a lithium ion battery, and a lithium ion polymer battery. Such secondary batteries are classified into lithium-based batteries and nickel-hydrogen-based batteries. The lithium-based batteries are mainly used for small products such as digital camera, P-DVD, MP3P, cellular phone, PDA, portable game device, power tool and E-bike, while the nickel-hydrogen-based batteries are mainly applied to and used for large products such as electric or hydride vehicles, which require high output.

Meanwhile, in case a battery is used as a power source, the battery should keep good insulation against external devices except for a battery management system. If the insulation of the battery is not kept, there occurs leakage current. If leakage current occurs, it can be primarily a factor of discharge of the battery and malfunction or breakdown of electronic equipment to which the battery is applied. In particular, if leakage current occurs in a high voltage battery in for example an electric or hybrid vehicle, the leaked current may fatally shock a person. Accordingly, in the related art, it is urgent to develop a scheme to thoroughly sense leakage current of a battery.

DISCLOSURE

Technical Problem

The present invention is designed to solve the problems of the prior art, and therefore it is an object of the present invention to provide apparatus and method for sensing leakage current of a battery, which allows to sense leakage current of a battery in an easy and accurate way by means of a simple leakage current sensing circuit.

Technical Solution

In order to accomplish the above object, the present invention provides an apparatus for sensing leakage current of a battery, comprising a voltage distribution node installed on a first conductive line connecting both terminals of a battery; first and second switches installed respectively between the voltage distribution node and positive and negative terminals of the battery; an insulation resistance and a current sensing resistance subsequently installed on a second conductive line connecting the voltage distribution node to a ground; a DC (Direct Current) voltage applying unit for selectively applying positive or negative DC voltage to a ground-side end of the current sensing resistance to induce a potential difference between the voltage distribution node and the DC voltage applying node; and a leakage current determining unit for sensing a magnitude of an electric current flowing through the current sensing resistance according to the induced potential difference in a turning-on state of the first and second switches, and then determining leakage current by checking whether the magnitude of the electric current is out of a standard level over a threshold value.

The apparatus for sensing leakage current of a battery according to the present invention may further include a capacitor connected in parallel between the insulation resistance and the current sensing resistance.

Preferably, the voltage distribution node is interposed between first and second resistances installed on the first conductive line, and the first and second resistances have the same resistance value.

Preferably, the DC voltage applying unit includes a third resistance connected between the ground and the current sensing resistance; third and fourth switches connected in parallel with the third resistance; a first DC power installed on a parallel conductive line opened or closed by the third switch to apply positive DC voltage to the ground-side end of the current sensing resistance when the third switch is turned on; and a second DC power installed on a parallel conductive line opened or closed by the fourth switch to apply negative DC voltage to the ground-side end of the current sensing resistance when the fourth switch is turned on.

In one aspect of the present invention, the leakage current determining unit includes a voltage amplifier for amplifying voltages at both ends of the current sensing resistance, caused by the electric current flowing through the current sensing resistance; an A/D (Analog/Digital) converter for converting an analog voltage signal output from the voltage amplifier into a digital voltage signal; and a CPU (Central Processing Unit) for receiving the digital voltage signal from the A/D converter, changing a magnitude of voltage into a magnitude of current according to the Ohm's law, and then determining leakage current by checking whether the magnitude of current is out of a standard level over a threshold value.

In another aspect of the present invention, the leakage current determining unit includes an in-line current sensing unit installed between the insulation resistance and the current sensing resistance; an A/D converter for converting an analog current signal output from the in-line current sensing unit into a digital voltage signal; and a CPU for receiving the digital current signal from the A/D converter, and then determining leakage current by checking whether the magnitude of the current signal is out of a standard level over a threshold value.

In the present invention, the leakage current determining unit may further include a leakage current warning unit for visually or auditorily warning an occurrence of leakage current, and in case leakage current occurs, the CPU may visually or auditorily output a warning of the occurrence of leakage current by means of the leakage current warning unit.

In the present invention, the leakage current determining unit may further include a switch controller for controlling the first and second switches and the third and fourth switches of the DC voltage applying unit.

In order to accomplish the above object, the present invention also provides a method for sensing leakage current of a battery, by using a voltage distribution node installed on a first conductive line connecting both terminals of a battery, first and second switches installed respectively between the voltage distribution node and both terminals of the battery, and an insulation resistance and a current sensing resistance subsequently installed on a second conductive line connecting the voltage distribution node to a ground, the method comprising (a) turning on the first and second switches; (b) selectively applying positive or negative DC voltage to a ground-side end of the current sensing resistance to induce a potential difference between the voltage distribution node and the ground-side end of the current sensing resistance; (c) sensing an electric current flowing through the current sensing resistance by means of the induced potential difference; and (d) determining leakage current by checking whether the sensed magnitude of current is out of a standard level over a threshold value.

In one aspect of the present invention, the step (b) includes amplifying voltages at both ends of the current sensing resistance into an analog voltage signal; converting the amplified analog voltage signal into a digital voltage signal; and changing a magnitude of the digital voltage signal into a magnitude of current according to the Ohm's law.

In another aspect of the present invention, the step (b) includes sensing an analog current signal flowing through the current sensing resistance by means of an in-line current sensing unit installed between the current sensing resistance and the insulation resistance; converting the sensed analog current signal into a digital current signal; and obtaining a magnitude of the electric current flowing through the current sensing resistance based on the digital current signal.

Preferably, the standard level includes a first standard level exhibiting a magnitude of an electric current flowing through the current sensing resistance when positive DC voltage is applied to the ground-side end of the current sensing resistance after the first and second switches are turned on; and a second standard level exhibiting a magnitude of an electric current flowing through the current sensing resistance when negative DC voltage is applied to the ground-side end of the current sensing resistance after the first and second switches turned on.

Preferably, the step (d) includes determining that leakage current occurs in case a magnitude of an electric current flowing through the current sensing resistance is different from the first standard level over a threshold value when positive DC voltage is applied to the ground-side end of the current sensing resistance; or determining that leakage current occurs in case a magnitude of an electric current flowing through the current sensing resistance is different from the second standard level over a threshold value when negative DC voltage is applied to the ground-side end of the current sensing resistance.

The method for sensing leakage current of a battery according to the present invention may further include the step of visually or auditorily warning an occurrence of leakage current in case leakage current occurs.

Advantageous Effect

According to the present invention, since leakage current of a battery is sensed using a simple leakage current sensing circuit using a DC power, so it is possible to sense leakage current of a battery in early stage and prevent discharge of the battery. Also, it is possible to prevent malfunction or breakdown of internal devices of a vehicle, caused by leakage current, in advance. In addition, it is possible to prevent injury of a person, caused by leakage current of a battery.

<Reference Numerals of Essential Parts in the Drawings>

| | |
|---|---|
| 100: load system | 200: battery |
| 300: leakage current sensing apparatus | 310: DC voltage applying unit |
| 320: leakage current determining unit | 321: voltage amplifier |
| 322: A/D converter | 323: CPU |
| 324: switch controller | 325: leakage current warning unit |

BEST MODE

Hereinafter, preferred embodiments of the present invention will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present invention on the basis of the principle that the inventor is allowed to define terms appropriately for the best explanation. Therefore, the description proposed herein is just a preferable example for the purpose of illustrations only, not intended to limit the scope of the invention, so it should be understood that other equivalents and modifications could be made thereto without departing from the spirit and scope of the invention.

Figure 1:
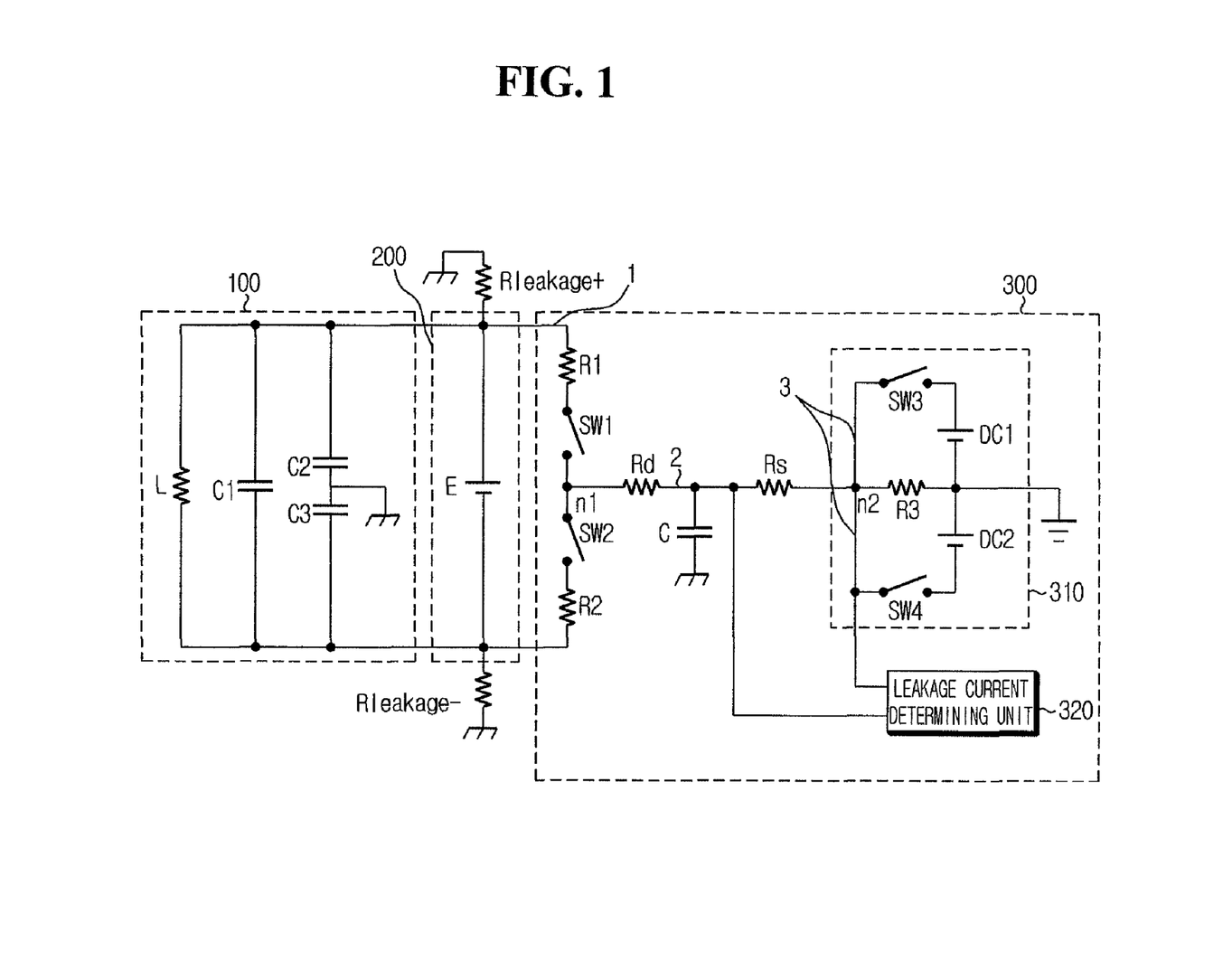
FIG. 1 is a circuit diagram showing an apparatus for sensing leakage current of a battery according to a preferred embodiment of the present invention.

FIG. 1 is a circuit diagram showing an apparatus for sensing leakage current of a battery according to a preferred embodiment of the present invention.

As shown in FIG. 1, the leakage current sensing apparatus 300 according to the present invention is connected to both terminals of a battery 200 in which a plurality of cells supplying power to a load system 100 are assembled, thereby sensing leakage current of the battery 200.

In this embodiment, the load system 100 is a means using electric energy output from the battery 200, which demands high voltage such as electric or hybrid vehicles. A load L of the load system 100, which consumes electric energy, may be composed of a motor for transferring power to an electric or hybrid vehicle, and a DC-to-DC converter for converting power output from the battery 200. However, the present invention is not limited in the kind of the load system 100. The load system 100 may include a DC/DC cap (C1) and Y-caps (C2, C3) for eliminating noise generated at the load system 100.

The battery 200 has a plurality of unit cells, which are rechargeable as a storage means of electric energy and electrically connected with each other. The unit cell is a electric double-layer capacitor having an ultra capacitor or a secondary battery such as a lithium ion battery, a lithium polymer battery, a nickel-cadmium battery, a nickel-hydrogen battery or a nickel-zinc battery. In this embodiment, the battery 200 outputs a high voltage DC power of 180V so as to supply power to the load system 100 that demands a high voltage like an electric or hybrid vehicle. However, the present invention is not limited thereto.

The leakage current sensing apparatus 300 according to the present invention includes a voltage distribution node n1 installed on a first conductive line 1 connecting both terminals of the battery 200 respectively, first and second resistances R1, R2 interposed between the voltage distribution node n1 and both terminals of the battery 200, first and second switches SW1, SW2 installed respectively between the voltage distribution node n1 and the first and second resistances R1, R2, an insulation resistance Rd and a current sensing resistance Rs interposed on a second conductive line 2 connecting the voltage distribution node n1 to a ground, a capacitor C connected in parallel between the insulation resistance Rd and the current sensing resistance Rs, a DC voltage applying unit 310 for selectively applying positive or negative DC voltage to a DC voltage applying node n2 installed at a ground-side end of the current sensing resistance Rs to induce a potential difference between the voltage distribution node n1 and the DC voltage applying node n2, and a leakage current determining unit 320 for sensing a magnitude of an electric current flowing through the current sensing resistance Rs according to the induced potential difference in a turning-on state of the first and second switches and then determining leakage current by checking whether the magnitude of current is out of a standard level over a threshold value.

Here, the DC voltage applying unit 310 includes a third resistance R3 interposed between the current sensing resistance Rs and the ground, third and fourth switches SW3, SW4 connected in parallel with the third resistance R3, a first DC power DC1 installed on a parallel conductive line 3 opened or closed by the third switch SW3 to apply positive DC voltage to the DC voltage applying node n2 when the third switch SW3 turns on, and a second DC power DC2 installed on a parallel conductive line 3 opened or closed by the fourth switch SW4 to apply negative DC voltage to the DC voltage applying node n2 when the fourth switch SW4 turns on.

Meanwhile, positive resistance leakage Rleakage+ and negative resistance leakage Rleakage− respectively displayed at both terminals of the battery 200 exhibit a status when leakage current occurs, and they expresses an equivalent value of a virtual resistance value that appears when leakage current occurs.

Now, it is explained how the leakage current sensing apparatus 300 according to the present invention senses leakage current of a battery 200. Hereinafter, it is assumed that the first DC power DC1 applies a potential +5V to the DC voltage applying node n2 and the second DC power DC2 applies a potential of −5V to the DC voltage applying node n2. However, the present invention is not limited thereto.

Operation modes of the leakage current sensing apparatus 300 according to the present invention include a standard level setting mode for setting a standard level used for determining leakage current when leakage current does not occur at the battery 200, namely when the battery 200 is initially installed to the load system 100 and thus in an ideal state, and a leakage current sensing mode for sensing leakage current of the battery 200 in an arbitrary battery usage environment.

In the standard level setting mode, the leakage current determining unit 320 turns on the first and second switches SW1, SW2 and turns off the third and fourth switches SW3, SW4 of the DC voltage applying unit 310. Then, voltage is distributed by means of the first and second resistances R1, R2 having the same resistance value and respectively interposed between the voltage distribution node n1 and both terminals of the battery 200, so a voltage approximate to 0V is applied to the voltage distribution node n1, and an electric current does not flow through the second conductive line 2. Also, the leakage current determining unit 320 turns the third switch SW3 of the DC voltage applying unit 310 to apply a voltage of +5V output from the first DC power DC1 to the DC voltage applying node n2. Then, a potential difference occurs between the voltage distribution node n1 with 0V and the DC voltage applying node n2 with +5V, and an electric current flows toward the voltage distribution node n1 through the current sensing resistance Rs interposed between the DC voltage applying node n2 and the voltage distribution node n1. At this time, the leakage current determining unit 320 senses the electric current flowing through the current sensing resistance Rs and then sets it as a first standard level.

Then, the leakage current determining unit 320 turns off the third switch SW3 of the DC voltage applying unit 310 and turns on the fourth switch SW4 to apply a voltage of −5V output from the second DC power DC2 to the DC voltage applying node n2. Then, a potential difference occurs between the voltage distribution node n1 with 0V and the DC voltage applying node n2 with −5V, and an electric current flows toward the DC voltage applying node n2 through the current sensing resistance Rs interposed between the DC voltage applying node n2 and the voltage distribution node n1. At this time, the leakage current determining unit 320 senses the electric current flowing through the current sensing resistance Rs and then sets it as a second standard level.

If the first and second standard levels are set as mentioned above, these values are stored in a memory (not shown) and then used as criteria for determining leakage current of the battery 200 in the leakage current sensing mode.

In the leakage current sensing mode, the leakage current determining unit 320 turns on the first and second switches SW1, SW2 and turns off the third and fourth switches SW3, SW4 of the DC voltage applying unit 310. If electric current occurs at any one of both terminals of the battery 200, the voltage of the voltage distribution node 1, to which a voltage of 0V was applied by means of the first and second resistances R1, R2, is changed into positive or negative voltage.

For sensing leakage current, the leakage current determining unit 320 turns on the third switch of the DC voltage applying unit 310, while keeping a turning-on state of the first and second switches SW1, SW2. Then, a voltage of +5V output from the first DC power DC! Is applied to the DC voltage applying node n2. Then, a potential difference occurs between the voltage distribution node n1 and the DC voltage applying node n2, and an electric current flows from the DC voltage applying node n2 to the voltage distribution node n1 through the current sensing resistance Rs. At this time, the leakage current determining unit 320 senses a magnitude of the electric current flowing through the current sensing resistance Rs. However, if the voltage of the voltage distribution node n1 does not have 0 value due to the occurrence of leakage current, the magnitude of electric current flowing through the current sensing resistance Rs is changed. For example, the magnitude of current is decreased lower than the first standard level if the voltage distribution node n1 has a positive voltage value, while the magnitude of electric current is increased higher than the first standard level if the voltage distribution node n1 has a negative voltage value. Thus, if a decreased or increased value of the current magnitude based on the first standard level exceeds a predetermined criterion, it may be determined that leakage current occurs.

Then, the leakage current determining unit 320 turns off the third switch SW3 of the DC voltage applying unit 310 and turns on the fourth switch SW4. Then, a voltage of −5V output from the second DC power DC2 is applied to the DC voltage applying node n2. Then, a potential difference occurs between the voltage distribution node n1 and the DC voltage applying node n2, and an electric current flows from the voltage distribution node n1 to the DC voltage applying node n2 through the current sensing resistance Rs. At this time, the leakage current determining unit 320 senses a magnitude of the electric current flowing through the current sensing resistance Rs. However, if the voltage of the voltage distribution node n1 does not have 0 value due to the occurrence of leakage current, the magnitude of electric current flowing through the current sensing resistance Rs is changed. For example, the magnitude of current is increased higher than the second standard level if the voltage distribution node n1 has a positive voltage value, while the magnitude of electric current is decreased lower than the second standard level if the voltage distribution node n1 has a negative voltage value. Thus, if an increased or decreased value of the current magnitude based on the second standard level exceeds a predetermined criterion, it may be determined that leakage current occurs.

Meanwhile, the capacitor C connected in parallel with the second conductive line 2 intercepts excessive voltage and noise applicable from the battery 200, thereby protecting the circuit of the leakage current determining unit 320.

Figure 2:
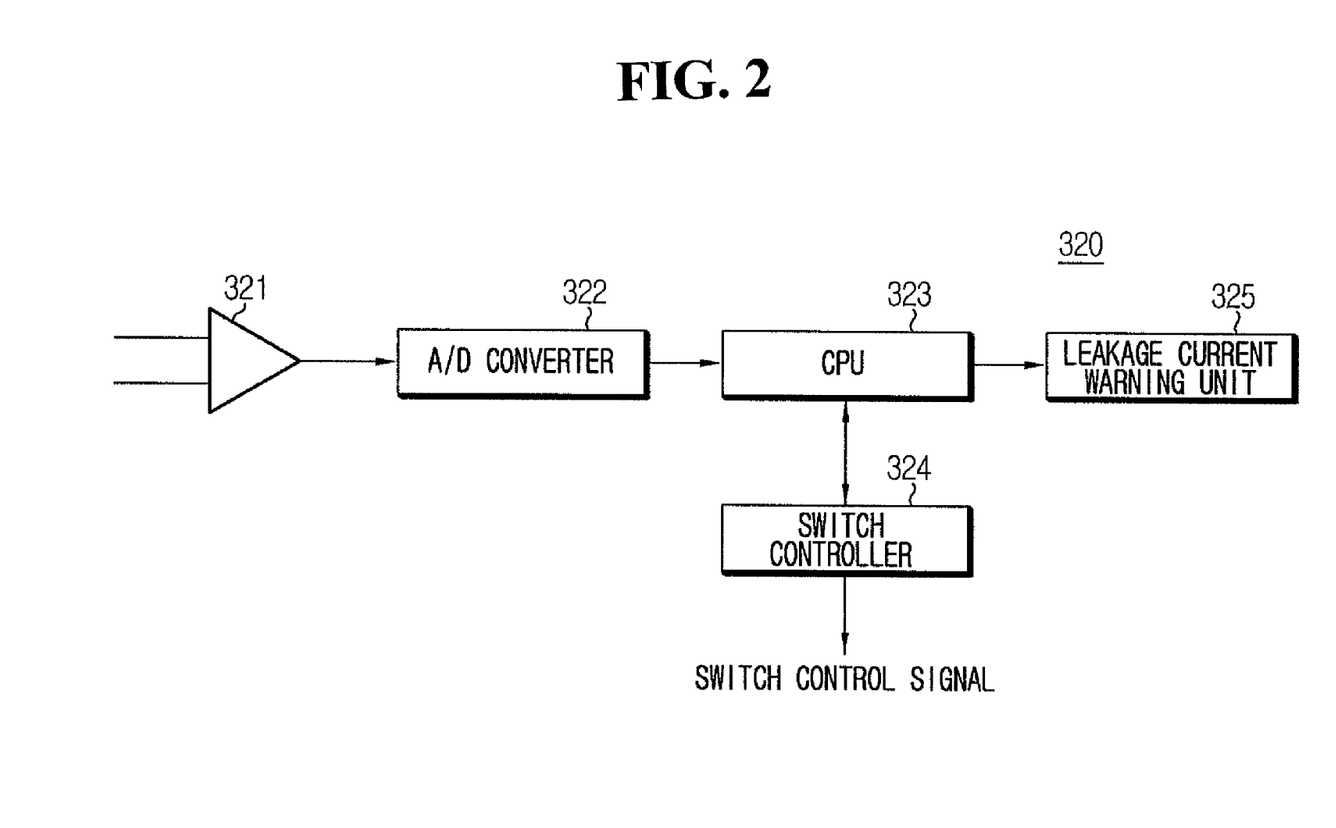
FIG. 2 is a block diagram showing a leakage current determining unit according to a preferred embodiment of the present invention.

FIG. 2 is a block diagram showing a leakage current determining unit according to a preferred embodiment of the present invention.

Referring to FIG. 2, the leakage current determining unit 320 includes a voltage amplifier 321, an A/D converter 322, a CPU 323, a switch controller 324 and a leakage current warning unit 325.

The voltage amplifier 321 amplifies voltages at both ends of the current sensing resistance Rs and outputs an analog voltage signal.

The A/D converter 322 converts the analog voltage signal output from the voltage amplifier 321 into a digital voltage signal.

The CPU 323 receives the digital voltage signal from the A/D converter 322 and changes a magnitude of voltage into a magnitude of current according to the Ohm's law. After that, the CPU 323 reads the first and second standard levels stored in the memory (not shown) and compares the changed magnitude of current with the first and second standard levels respectively, thereby determining whether leakage current occurs at the battery 200. Namely, if the changed magnitude of current is increased or decreased over a threshold value based on the first and second standard levels, the CPU 323 determines that there occurs leakage current.

The switch controller 324 selectively controls the first and second switches SW1, SW2 and the third and fourth switches SW3, SW4 of the DC voltage applying unit 310 according to the control of the CPU 323.

The leakage current warning unit 325 visually or auditorily warns leakage current if a leakage current occurrence signal is input from the CPU 323. The leakage current warning unit 325 includes LED, LCD, alarm, or their combination. In this case, if a leakage current occurrence signal is input, the leakage current warning unit 325 flickers LED, outputs a warning message to LCD, or generates an alarming sound to inform a user of the leakage current occurrence. The LED, LCD and alarm are just examples of the leakage current alarming unit 325, and it would be obvious to those having ordinary skill in the art that various kinds of visual or auditory warning devices may be used as the leakage current warning unit 325.

Meanwhile, in this embodiment, a magnitude of voltage at both ends of the current sensing resistance Rs is sensed and then changed into a magnitude of current according to the Ohm's law, and then the occurrence of leakage current is determined based on the changed magnitude of current. As an alternative, it is also possible to install an in-line current sensing unit capable of directly sensing an electric current between the insulation resistance Rd and the current sensing resistance Rs and then determine the occurrence of leakage current of a battery based on the magnitude of electric current sensed by the in-line current sensing unit.

Figure 3:
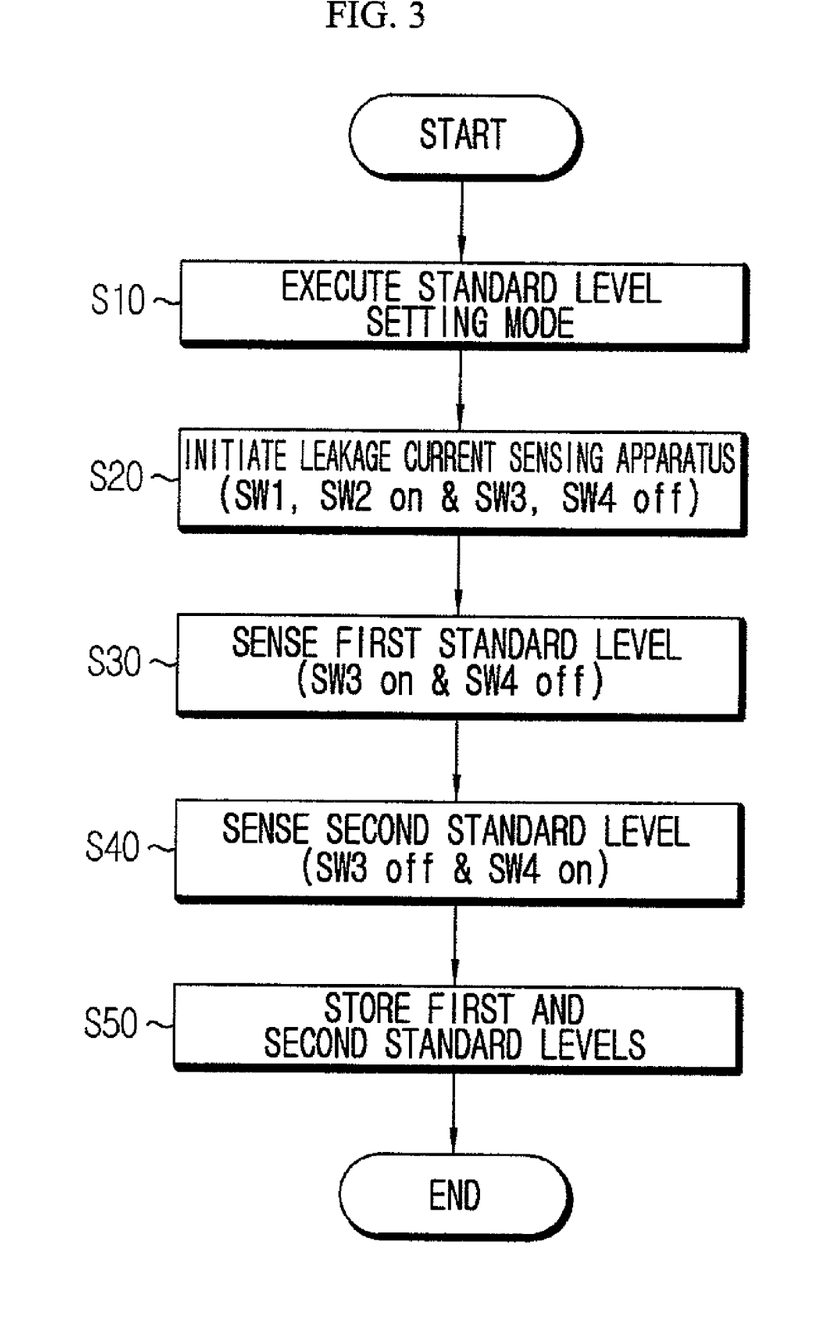
FIG. 3 is a flowchart illustrating a standard level setting mode in a method for sensing leakage current of a battery according to a preferred embodiment of the present invention.

FIG. 3 is a flowchart illustrating the standard level setting mode in the method for sensing leakage current of a battery according to a preferred embodiment of the present invention.

First, in the step S10, the leakage current determining unit 320 executes a standard level setting program that allows operation of the standard level setting mode.

In the step S20, the leakage current determining unit 320 turns on the first and second switches SW1, SW2 and turns off the third and fourth switches SW3, SW4 to initiate the leakage current sensing apparatus 300.

In the step S30, the leakage current determining unit 320 turns on the third switch SW3 to apply a voltage of +5V output from the first DC power DC1 to the DC voltage applying node n2, and then senses a magnitude of an electric current flowing through the current sensing resistance Rs to set the magnitude of electric current as a first standard level.

In the step S40, the leakage current determining unit 320 turns off the third switch SW3 and turns on the fourth switch SW4 to apply a voltage of −5V output from the second DC power DC2 to the DC voltage applying node n2, and then senses a magnitude of an electric current flowing through the current sensing resistance Rs to set the magnitude of electric current as a second standard level.

In the step 50, the leakage current determining unit 320 stores the first and second standard levels set at the steps S30 and S40 to the memory.

The above steps S10 to S50 can be executed only once. However, for enhancing reliability of the standard levels, the steps S10 to S40 may be executed several times such that average values of a plurality of sensed first and second standard levels are set as first and second standard levels.

Figure 4:
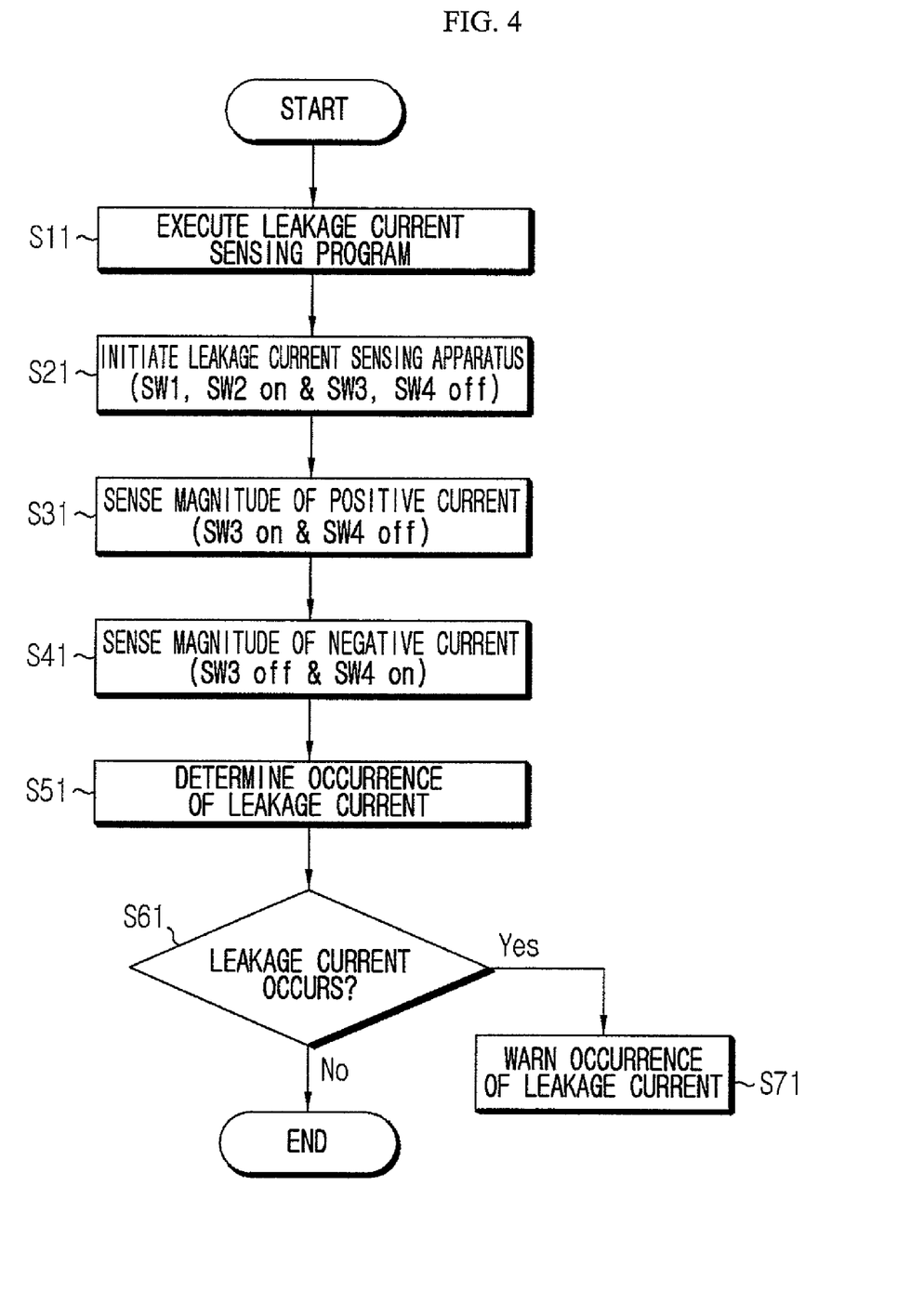
FIG. 4 is a flowchart illustrating a leakage current sensing mode in the method for sensing leakage current of a battery according to a preferred embodiment of the present invention.

FIG. 4 is a flowchart illustrating the leakage current sensing mode in the method for sensing leakage current of a battery according to a preferred embodiment of the present invention.

First, in the step S11, the leakage current determining unit 320 executes a leakage current sensing program that allows operation of the leakage current sensing mode.

In the step S21, the leakage current determining unit 320 turns on the first and second switches SW1, SW2 and turns off the third and fourth switches SW3, SW4 to initiate the leakage current sensing apparatus 300.

In the step S31, the leakage current determining unit 320 turns on the third switch SW3 to apply a voltage of +5V output from the first DC power DC1 to the DC voltage applying node n2, and then senses a magnitude of an electric current flowing through the current sensing resistance Rs.

In the step S41, the leakage current determining unit 320 turns off the third switch SW3 and turns on the fourth switch SW4 to apply a voltage of −5V output from the second DC power DC2 to the DC voltage applying node n2, and then senses a magnitude of an electric current flowing through the current sensing resistance Rs.

In the step S51, the leakage current determining unit 320 compares the magnitudes of current respectively sensed at the steps S31 and S41 with the first and second standard levels to determine whether or not leakage current occurs. The method for determining leakage current is already explained above.

In the step S61, the leakage current determining unit 320 executes the process into two ways depending on the determination result at the step S51. If it is determined that there occurs no leakage current, the leakage current determining unit 320 ends the process of sensing leakage current. However, if it is determined that there occurs leakage current, the leakage current determining unit 320 executes the process to the step S71.

In the step S71, the leakage current determining unit 320 visually or auditorily warns the leakage current of the battery 200 to a user.

It would be apparent to those having ordinary skill in the art that the above steps S11 to S71 may be repeatedly executed at regular cycles while the load system 100 is in operation.

The present invention has been described in detail. However, it should be understood that the detailed description and specific examples, while indicating preferred embodiments of the invention, are given by way of illustration only, since various changes and modifications within the spirit and scope of the invention will become apparent to those skilled in the art from this detailed description.

What is claimed is:

1. An apparatus for sensing a leakage current of a battery, the apparatus comprising:
   a current sensing resistance installed on a current detection path of positive and negative terminals of the battery;
   a DC (Direct Current) voltage applying unit for inducing a potential difference with an opposite polarity to the current detection path through the current sensing resistance; and
   a leakage current determining unit for sensing a magnitude of current flowing through the current sensing resistance according to the induced potential difference on the current detection path, and determining based on the sensed magnitude of current whether the leakage current occurs.

2. The apparatus for sensing a leakage current of a battery according to claim 1, further comprising:
   a first conductive line connected to the positive and negative terminals of the battery;
   a voltage distribution node installed on the first conductive line;
   a second conductive line diverging from the voltage distribution node; and
   first and second switches installed respectively between the voltage distribution node and the positive and negative terminals of the battery.

3. The apparatus for sensing a leakage current of a battery according to claim 2, wherein, when the positive and negative terminals of the battery are connected to the current detection path, the first and second switches simultaneously turn on by a control of the leakage current determining unit.

4. The apparatus for sensing a leakage current of a battery according to claim 2, wherein the DC voltage applying unit is located on the second conductive line, and wherein the current sensing resistance is installed between the voltage distribution node and the DC voltage applying unit.

5. The apparatus for sensing a leakage current of a battery according to claim 4, wherein an insulation resistance is further installed between the voltage distribution node and the current sensing resistance, and wherein the apparatus further comprises a capacitor connected in parallel between the insulation resistance and the current sensing resistance.

6. The apparatus for sensing a leakage current of a battery according to claim 2, further comprising first and second resistances installed respectively between the voltage distribution node and the positive and negative terminals of the battery.

7. The apparatus for sensing a leakage current of a battery according to claim 6, wherein the first and second resistances have the same resistance value.

8. The apparatus for sensing a leakage current of a battery according to claim 1, wherein the DC voltage applying unit is installed between the current sensing resistance and a ground.

9. The apparatus for sensing a leakage current of a battery according to claim 8, wherein the DC voltage applying unit includes:
   a third resistance connected between the ground and the current sensing resistance;
   third and fourth switches connected in parallel with the third resistance;
   a first DC power for applying a positive DC voltage to the current sensing resistance when the third switch is turned on; and
   a second DC power for applying a negative DC voltage to the current sensing resistance when the fourth switch is turned on.

10. The apparatus for sensing a leakage current of a battery according to claim 1, wherein the leakage current determining unit includes:
    a voltage amplifier for amplifying a potential difference between both ends of the current sensing resistance, induced by the current flowing through the current sensing resistance, and outputting the amplified potential difference;
    an A/D (Analog/Digital) converter for converting an analog voltage signal output by the voltage amplifier into a digital voltage signal; and
    a CPU (Central Processing Unit) for calculating a magnitude of current based on the digital voltage signal converted by the A/D converter, and determining based on the magnitude of current whether the leakage current occurs.

11. The apparatus for sensing a leakage current of a battery according to claim 1, wherein the leakage current determining unit includes:
    an in-line current sensing unit for measuring a magnitude of current flowing through the current sensing resistance and outputting the measured magnitude of current;
    an A/D converter for converting an analog current signal output by the in-line current sensing unit into a digital voltage signal; and
    a CPU for determining based on the magnitude of current calculated from the digital current signal converted by the A/D converter whether the leakage current occurs.

12. The apparatus for sensing a leakage current of a battery according to claim 1, wherein the leakage current determining unit determines that the leakage current occurs when the sensed magnitude of current flowing through the current sensing resistance is a standard level over a threshold value.

13. The apparatus for sensing a leakage current of a battery according to claim 12, wherein, in a standard level setting mode, the leakage current determining unit sets standard levels so that a magnitude of current flowing through the current sensing resistance when the positive DC voltage is applied to the current sensing resistance through the DC voltage applying unit is a first standard level, and a magnitude of current flowing through the current sensing resistance when the negative DC voltage is applied to the current sensing resistance through the DC voltage applying unit is a second standard level.

14. The apparatus for sensing a leakage current of a battery according to claim 13, in a leakage current sensing mode,
wherein the leakage current determining unit determines that the leakage current occurs when the magnitude of current flowing through the current sensing resistance is different from the first standard level over the threshold value when the positive DC voltage is applied to the current sensing resistance through the DC voltage applying unit; or
wherein the leakage current determining unit determines that the leakage current occurs when the magnitude of current flowing through the current sensing resistance is different from the second standard level over the threshold value when the negative DC voltage is applied to the current sensing resistance through the DC voltage applying unit.

15. The apparatus for sensing a leakage current of a battery according to claim 1, wherein the leakage current determining unit further includes a leakage current warning unit for visually or auditorily warning an occurrence of the leakage current, and wherein, when the leakage current occurs, the occurrence of the leakage current is warned visually or auditorily by means of the leakage current warning unit.

16. A system, comprising:
the apparatus for sensing a leakage current of a battery according to claim 1;
the battery; and
a load connected to the battery.

17. A method for sensing a leakage current of a battery, the method comprising:
(a) connecting positive and negative terminals of the battery to a current detection path;
(b) inducing, by a DC (Direct Current) voltage applying unit, a potential difference with an opposite polarity to the current detection path through a current sensing resistance;
(c) sensing, by a leakage current determining unit, a magnitude of current flowing through the current sensing resistance by means of a potential difference induced on the current detection path; and
(d) determining based on the sensed magnitude of current whether the leakage current occurs.

18. The method for sensing a leakage current of a battery according to claim 17, wherein the step (c) includes:
amplifying the potential difference between both ends of the current sensing resistance, induced by the current flowing through the current sensing resistance, and outputting the amplified potential difference as an analog voltage signal;
converting the output analog voltage signal into a digital voltage signal; and
calculating the magnitude of current based on the digital voltage signal.

19. The method for sensing leakage current of a battery according to claim 17, wherein the step (c) includes:
measuring the magnitude of current flowing through the current sensing resistance and outputting the measured magnitude of current as an analog voltage signal;
converting the output analog current signal into a digital current signal; and
obtaining the magnitude of current based on the digital current signal.

20. The method for sensing a leakage current of a battery according to claim 17, wherein the step (d) includes determining that the leakage current occurs when the sensed magnitude of current flowing through the current sensing resistance is standard level over a threshold value.

21. The method for sensing a leakage current of a battery according to claim 20, further comprising a standard level setting step, before the step (a),
wherein the standard level setting step includes setting standard levels so that a magnitude of current flowing through the current sensing resistance when a positive DC voltage is applied to the current sensing resistance is a first standard level, and a magnitude of current flowing through the current sensing resistance when a negative DC voltage is applied to the current sensing resistance is a second standard level.

22. The method for sensing a leakage current of a battery according to claim 21, wherein the step (d) includes:
determining that the leakage current occurs when a magnitude of current flowing through the current sensing resistance is different from the first standard level over the threshold value when the positive DC voltage is applied to the current sensing resistance; or
determining that the leakage current occurs when a magnitude of current flowing through the current sensing resistance is different from the second standard level over the threshold value when the negative DC voltage is applied to the current sensing resistance.

23. The method for sensing a leakage current of a battery according to claim 17, further comprising:
visually or auditorily warning an occurrence of the leakage current when it is determined that the leakage current occurs.

* * * * *